(12) United States Patent
Joo (10) Patent No.: US 12,224,341 B2
(45) Date of Patent: Feb. 11, 2025

(54) SEMICONDUCTOR DEVICE AND METHOD OF MANUFACTURING THE SAME

(71) Applicants: Hyundai Motor Company, Seoul (KR); Kia Corporation, Seoul (KR)

(72) Inventor: NackYong Joo, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 238 days.

(21) Appl. No.: 17/400,345

(22) Filed: Aug. 12, 2021

(65) Prior Publication Data
US 2022/0173241 A1 Jun. 2, 2022

(30) Foreign Application Priority Data
Nov. 30, 2020 (KR) .................. 10-2020-0164307

(51) Int. Cl.
| | |
|---|---|
| H01L 29/78 | (2006.01) |
| H01L 29/417 | (2006.01) |
| H01L 29/423 | (2006.01) |
| H01L 29/66 | (2006.01) |

(52) U.S. Cl.
CPC .... *H01L 29/7813* (2013.01); *H01L 29/41741* (2013.01); *H01L 29/4236* (2013.01); *H01L 29/66734* (2013.01)

(58) Field of Classification Search
CPC ............. H01L 29/7813; H01L 29/4238; H01L 29/1095; H01L 29/42376; H01L 29/42368
See application file for complete search history.

(56) References Cited

U.S. PATENT DOCUMENTS

| | | | |
|---|---|---|---|
| 2005/0037579 A1* | 2/2005 | Numazawa | H01L 21/28211 |
| | | | 257/E29.136 |
| 2018/0069115 A1* | 3/2018 | Sugai | H01L 29/0688 |
| 2018/0158938 A1* | 6/2018 | Kyogoku | H01L 29/407 |
| 2019/0288074 A1* | 9/2019 | Takeuchi | H01L 29/7397 |
| 2022/0037523 A1* | 2/2022 | Oda | H01L 29/407 |

* cited by examiner

*Primary Examiner* — Samuel A Gebremariam
*Assistant Examiner* — Jonas T Beardsley
(74) *Attorney, Agent, or Firm* — MCDONNELL BOEHNEN HULBERT & BERGHOFF LLP (57) ABSTRACT

A semiconductor device according to an embodiment of the present disclosure includes: a conductive region, an end region positioned at a portion where the conductive region ends, and a connection region positioned between the conductive region and the end region. The conductive region includes: an n+ type substrate; an n− type layer positioned at the first surface of the n+ type substrate; and a p type region positioned on the n− type layer, and a gate electrode that fills an inside of a trench penetrating the p type region and positioned in the n− type layer, and a side wall of the trench positioned at the portion where the conductive region ends is inclined.

15 Claims, 12 Drawing Sheets

SEMICONDUCTOR DEVICE AND METHOD OF MANUFACTURING THE SAME

CROSS-REFERENCE TO RELATED APPLICATIONS

This application claims priority to and the benefit of Korean Patent Application No. 10-2020-0164307 filed in the Korean Intellectual Property Office on Nov. 30, 2020, the entire contents of which are incorporated herein by reference.

FIELD

The present disclosure relates to a semiconductor device including a trench gate and a manufacturing method thereof.

BACKGROUND

A metal oxide semiconductor field effect transistor (hereinafter referred to as "MOSFET") is a three-terminal device that may conduct a current according to a gate control, particularly a power semiconductor MOSFET for a switching requires a high voltage and a large current.

Meanwhile, SiC power devices are superior to Si devices in high voltage and high current characteristics, so research and making them commercially available are actively underway. Among the structures to satisfy a large current, in a trench gate MOSFET having a trench gate, Poly-Si of the gate and a gate runner are connected through Poly-Si at the end of the gate, and the gate runner is again connected to a gate pad for applying a voltage.

In this structure, a step exists at the end of the gate (a trench edge part) where the trench ends, such that the electric field is concentrated, which causes the electric field to concentrate on the oxide film at the trench edge part, thereby causing destruction of an oxide film. This is a phenomenon that reduces the breakdown voltage in the trench gate MOSFET and is a factor that deteriorates the performance of the power semiconductor MOSFET that requires a high voltage.

The above information disclosed in this Background section is only for enhancement of understanding of the background of the disclosure, and therefore it may contain information that does not form the prior art that is already known in this country to a person of ordinary skill in the art.

SUMMARY

An object of the present disclosure is to provide a semiconductor device with an improved breakdown voltage by alleviating the electric field concentrated on the trench edge portion.

Another object of the present disclosure is to provide a manufacturing method of a semiconductor device that does not require the development of a new process technology.

According to an embodiment of the present disclosure, in a semiconductor device including a conductive region, an end region positioned at a portion where the conductive region ends, and a connection region positioned between the conductive region and the end region, the semiconductor device in which the conductive region includes an n+ type substrate; an n− type layer positioned at the first surface of the n+ type substrate; and a p type region positioned on the n− type layer, and a gate electrode that fills an inside of a trench penetrating the p type region and positioned in the n− type layer, and a side wall of the trench positioned at the portion where the conductive region ends is inclined is provided.

The angle between the bottom surface of the trench and the inclined side wall may be more than 90 degrees to less than 180 degrees.

The angle between the bottom surface of the trench and the inclined side wall may be greater than 135 degrees to less than 160 degrees.

A region under the inclined side wall of the trench may be filled with an insulating material.

A region under the inclined side wall of the trench may be where the n− type layer and the p type region are stacked.

The inclined side wall of the trench may have a shape that is concave downward.

The inclined side wall of the trench may have a shape that is convex upward.

The connection region may include the n+ type substrate, the n− type layer positioned in the first surface of the n+ type substrate, the p type region positioned on the n− type layer, a lower gate runner positioned on the p type region and connected to the gate electrode, an end oxide layer positioned on the lower gate runner, and an upper gate runner positioned on the end oxide layer.

The side wall of the trench connecting the bottom surface of the trench and the lower gate runner may be inclined.

The oxide layer may include a contact hole exposing a part of the lower gate runner, and the upper gate runner may be in contact with the lower gate runner through the contact hole of the oxide layer.

The conductive region may include an oxide layer positioned on the gate electrode, and a source electrode positioned on the oxide layer and insulated from the gate electrode.

The conductive region, the connection region, the end region, or a combination thereof may include a drain electrode positioned on the second surface of the substrate.

According to another embodiment of the present disclosure, a manufacturing method of a semiconductor device, including: forming an n− type layer on a first surface of an n+ type substrate including a conductive region, an end region positioned at a portion where the conductive region ends, and a connection region positioned between the conductive region and the end region; etching the n− type layer to form a trench; and forming a gate electrode in the trench is provided, wherein in the forming of the trench, a side wall of the trench positioned at the portion where the conductive region ends is etched to be inclined.

The manufacturing method of the semiconductor device may further include forming a p type region on the n− type layer.

After forming the p type region even in the region where the trench will be formed, the p type region and the n− type layer may be etched so that the side wall of the trench is inclined.

The forming of the trench may include filling the etched region with an insulating material after etching the region where the trench will be formed, and wet etching the insulating material so that the side wall of the trench is inclined.

The manufacturing method of the semiconductor device may further include: forming an oxide layer on the gate electrode; and forming a source electrode on the oxide layer.

The manufacturing method of the semiconductor device may further include forming a drain electrode on the second surface of the n+ type substrate.

In the semiconductor device of the present disclosure, the breakdown voltage is improved by alleviating the electric field concentrated on the trench edge portion.

In addition, since the manufacturing method of the semiconductor device of the present disclosure may be manufactured using an ion implantation process and an epi process, the development of a new process technology is not required.

DETAILED DESCRIPTION

Embodiments of the present disclosure will be described in detail with reference to the accompanying drawings. However, the present disclosure is not limited to embodiments described herein, but may be embodied in other forms. Rather, embodiments described herein are provided to thoroughly and completely understand the disclosed contents and to sufficiently transfer the ideas of the present disclosure to a person of ordinary skill in the art.

In the drawings, the thickness of layers and regions is exaggerated for clarity. It is to be noted that when a layer is referred to as being "on" another layer or substrate, it can be directly formed on the other layer or substrate or can be formed the other layer or substrate through a third layer interposed therebetween. Like constituent elements are denoted by like reference numerals denotes throughout the specification.

Figure 1:
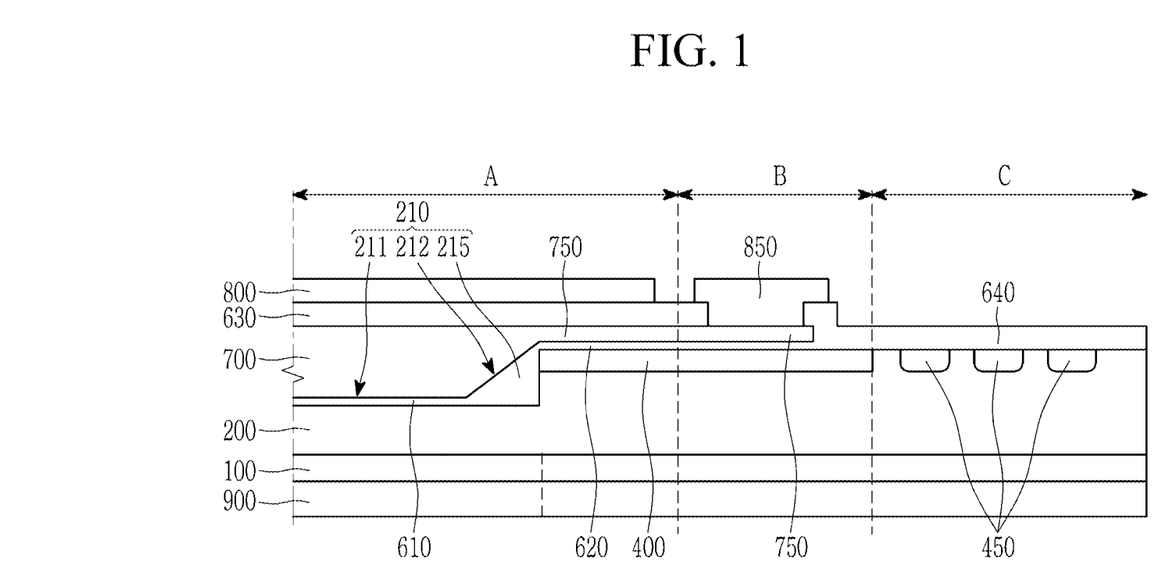
FIG. 1 is a view showing a cross-section of a semiconductor device according to an embodiment of the present disclosure.

FIG. 1 is a view showing a cross-section of a semiconductor device according to an embodiment of the present disclosure. FIG. 1 is a cross-sectional view taken along a horizontal direction to a direction that a gate electrode extends.

Referring to FIG. 1, the semiconductor device includes a conductive region A, a connection region B, and an end region C. The conductive region A is a region through which a current flows when a forward direction voltage is applied, the end region C is a region positioned in the portion where the conductive region A ends, and the connection region B is a region positioned between the conductive region A and the end region C.

The semiconductor device includes an n+ type substrate 100, an n− type layer 200, a p type region 400, a p type end structure 450, a gate electrode 700, a lower gate runner 750, an upper gate runner 850, a source electrode 800, and a drain electrode 900.

Specifically, the n+ type substrate 100 may be an n+ type silicon carbide substrate. The n− type layer 200 is positioned on the first surface of the n+ type substrate 100.

The trench 210 is positioned in the n− type layer 200 of the conductive region A. The p type region 400 is positioned on the side of the trench 210 and on the n− type layer 200.

Alternatively, an n+ type region (not shown) may be positioned on the side of the trench 210 and positioned within the p type region 400. Also, a p+ type region (not shown) may be positioned within the p type region 400 and positioned on the side of the n+ type region (not shown).

The gate insulating layer 610 is positioned inside the trench 210, and the gate electrode 700 is positioned on the gate insulating layer 610. The gate electrode 700 fills the inside of the trench 210 and may be protruded out of the trench 210. The gate electrode 700 may include a polysilicon or a metal.

An oxide layer 630 is positioned on the gate electrode 700. Alternatively, the oxide layer 630 may also be positioned on the n+ type region (not shown), the p+ type region (not shown), or the p type region 400.

The source electrode 800 is positioned on the oxide layer 630. The source electrode 800 is insulated from the gate electrode 700 by the oxide layer 630. The source electrode 800 may include an ohmic metal.

The p type region 400 positioned on the side of the trench 210 positioned adjacent to the end region C extends to the connection region B. An end insulating layer 620 may be positioned on the p type region 400. The end insulating layer 620 may include the same material as the gate insulating layer 610.

The lower gate runner 750 is positioned on the end insulating layer 620. The lower gate runner 750 is connected to the gate electrode 700 positioned adjacent to the end region C, and as an example, it may be connected to the gate electrode 700 protruded outside the trench 210. The lower gate runner 750 may be the same material as the gate electrode 700, and may include a polysilicon or a metal.

The end oxide layer 640 is positioned on the lower gate runner 750 and the end insulating layer 620, and the upper gate runner 850 is positioned on the end oxide layer 640. The end oxide layer 640 may include the same material as the oxide layer 630. The upper gate runner 850 may include the same material as the source electrode 800.

The end oxide layer 640 includes a contact hole exposing a part of the lower gate runner 750, and the upper gate runner 850 is in contact with the lower gate runner 750 through the contact hole. The lower gate runner 750 and the upper gate runner 850 are for quickly applying a gate voltage to the gate electrode 700.

The p type end structure 450 is positioned in the n– type layer 200 of the end region C. The p type end structure 450 includes a plurality of regions injected with p type ions, and the regions injected with the p type ions are spaced apart from each other by a predetermined interval.

The thickness of the region implanted with the p type ions for forming the p type end structure 450 is smaller than the depth of the trench 210. Also, the thickness of the region implanted with the p type ions for forming the p type end structure 450 may be the same as the thickness of the portion of the p type region 400.

The end insulating layer 620 and the end oxide layer 640 are extended up to the p type end structure 450 and the n– type layer 200 of the end region C.

The drain electrode 900 is positioned on the second surface of the n+ type substrate 100. The drain electrode 900 may include an ohmic metal. Here, the second surface of the n+ type substrate 100 is positioned on the side opposite to the first surface of the n+ type substrate 100.

On the other hand, the side wall 212 of the trench 210 is inclined. That is, the angle formed by the bottom surface 211 and the side wall 212 of the trench 210 is not vertical (90 degrees).

The trench 210 including the inclined side wall 212 may be the portion at which the conductive region A ends, that is, may be the trench 210 positioned closest to the end region C. Accordingly, the side wall 212 of the trench 210 connecting the bottom surface 211 of the trench 210 and the lower gate runner 750 is inclined.

For the gate electrode 700 formed inside the trench 210, the gate electrode 700 and the upper gate runner 850 are connected through the lower gate runner 750 at the end portion of the gate electrode 700, on the trench edge portion where the trench 210 ends, and when the angle formed by the bottom surface 211 of the trench 210 and the side wall 212 is vertical (90 degrees), the step is formed and then the electric field is concentrated. Due to this, the electric field is concentrated in the oxide layer of the trench edge portion, and the oxide layer is destroyed.

In the semiconductor device according to an embodiment, by inclining the side wall of the trench 210 positioned closest to the end region C, the electric field concentrated on the trench edge portion may be alleviated, thereby improving a breakdown voltage. That is, when the inclined side wall 212 is introduced into the trench 210, the electric field concentrated in the perpendicular portion of the trench edge is dispersed in an inclined shape, thereby weakening the electric field applied to the oxide layer. At the same voltage, the electric field applied to the oxide layer is weakened, so the reliability of the oxide layer increases in the repeated operations, and the breakdown voltage may be increased as a maximum voltage to be applied increases.

The angle formed by the bottom surface 211 of the trench 210 and the inclined side wall 212 may be greater than 90 degrees to less than 180 degrees, for example, more than 135 degrees to 160 degrees or less.

The region 215 under the inclined side wall 212 of the trench 210 may be filled with an insulating material.

The region 215 under the inclined side wall 212 of the trench 210 is a region surrounded by the inclined side wall 212, a line extending horizontally at the intersection point of the inclined side wall 212 and the bottom surface 211 of the trench 210, and a line extending vertically at the intersection of the inclined side wall 212 and the lower gate runner 750.

The insulating material may be the same material as the gate insulating layer 610.

That is, In FIG. 1, the inclined insulating layer is formed on the trench edge portion, but the insulating layer is formed thicker toward the trench edge end portion, so that the electric field increases gently along the slope, thereby alleviating the electric field concentration phenomenon.

Figure 2:
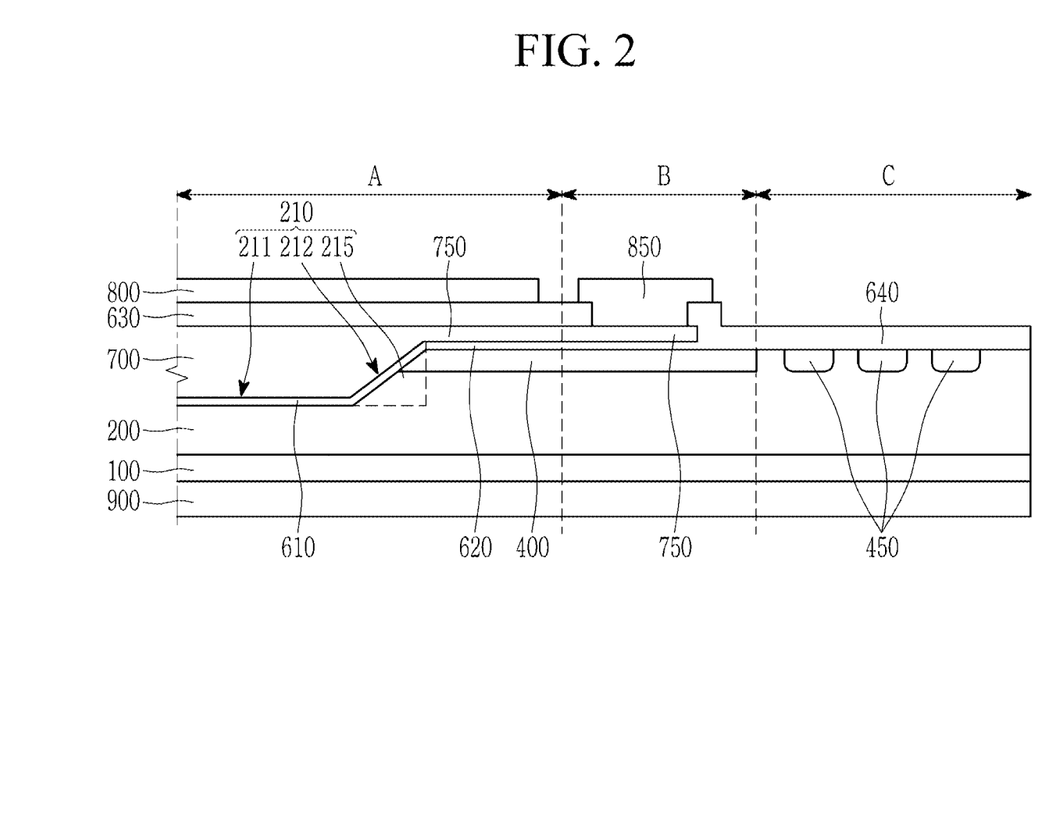
FIG. 2 is a view showing a cross-section of a semiconductor device according to another embodiment of the present disclosure.

FIG. 2 is a view showing a cross-section of a semiconductor device according to another embodiment of the present disclosure.

Referring to FIG. 2, the n– type layer 200 and the p type region 400 are stacked in the region 215 under the inclined side wall 212 of the trench 210. The gate insulating layer 610 may also be positioned on the inclined side wall 212 of trench 210.

That is, in FIG. 2, while the thickness of the gate insulating layer 610 is kept constant by forming the trench itself to be inclined, the electric field rises gently along the inclination, thereby alleviating the electric field concentration phenomenon.

FIG. 3 to FIG. 6 are views showing a cross-section of a semiconductor device according to another embodiment of the present disclosure.

Figure 3:
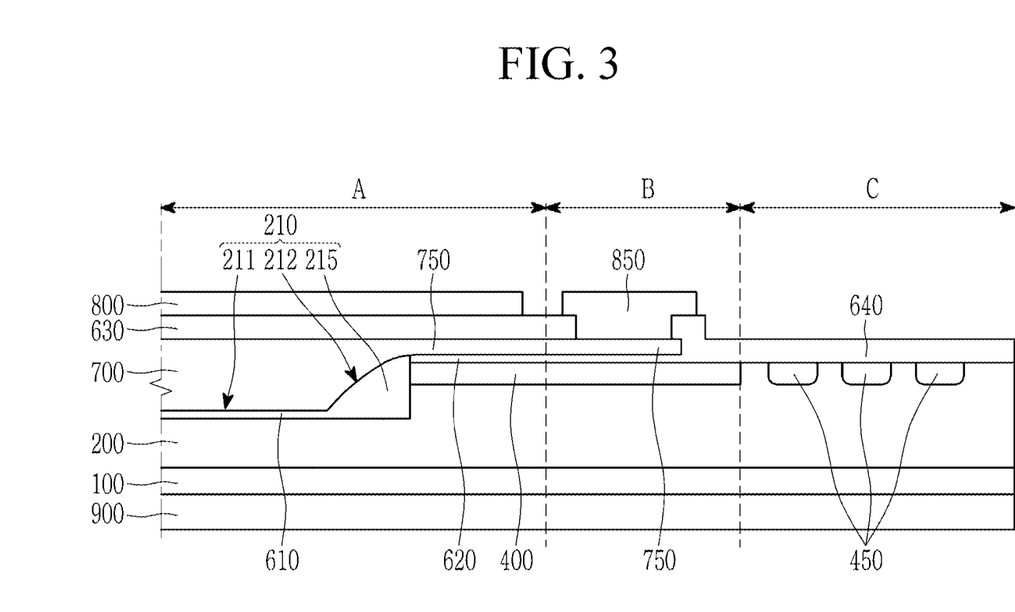
FIG. 3 is a view showing a cross-section of a semiconductor device according to another embodiment of the present disclosure.
Figure 4:
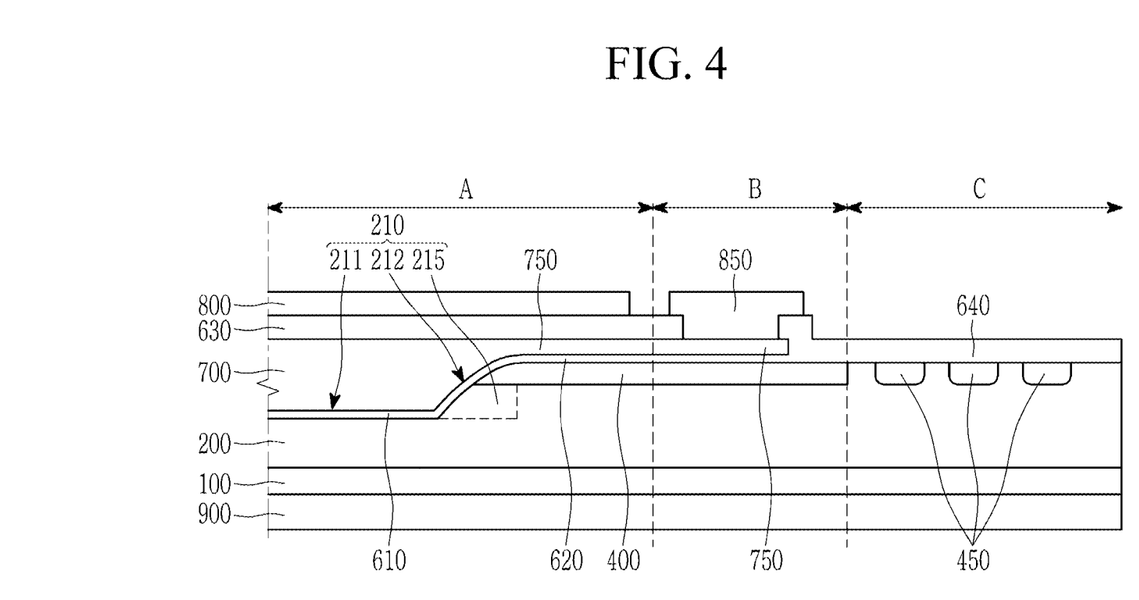
FIG. 4 is a view showing a cross-section of a semiconductor device according to another embodiment of the present disclosure.
Figure 5:
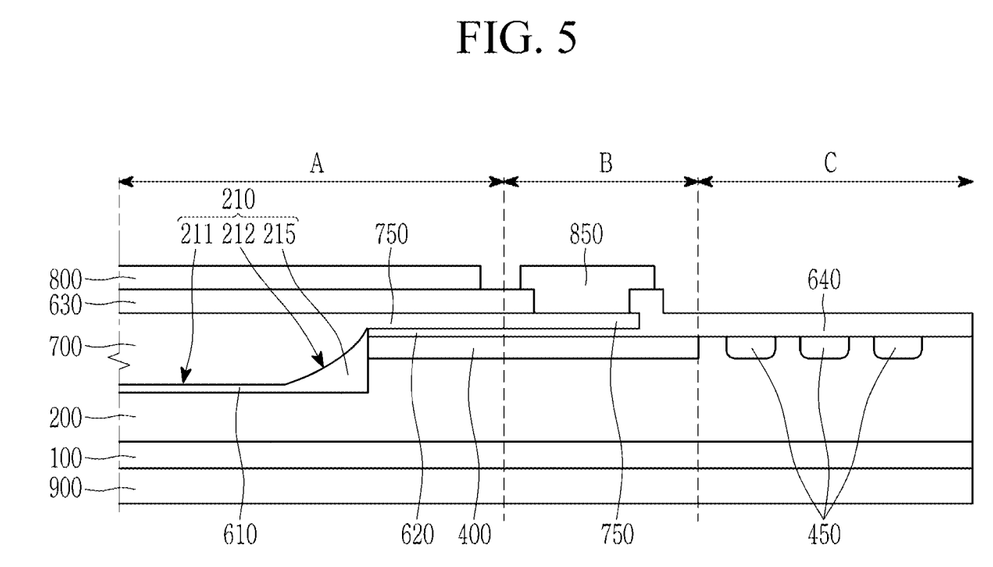
FIG. 5 is a view showing a cross-section of a semiconductor device according to another embodiment of the present disclosure.
Figure 6:
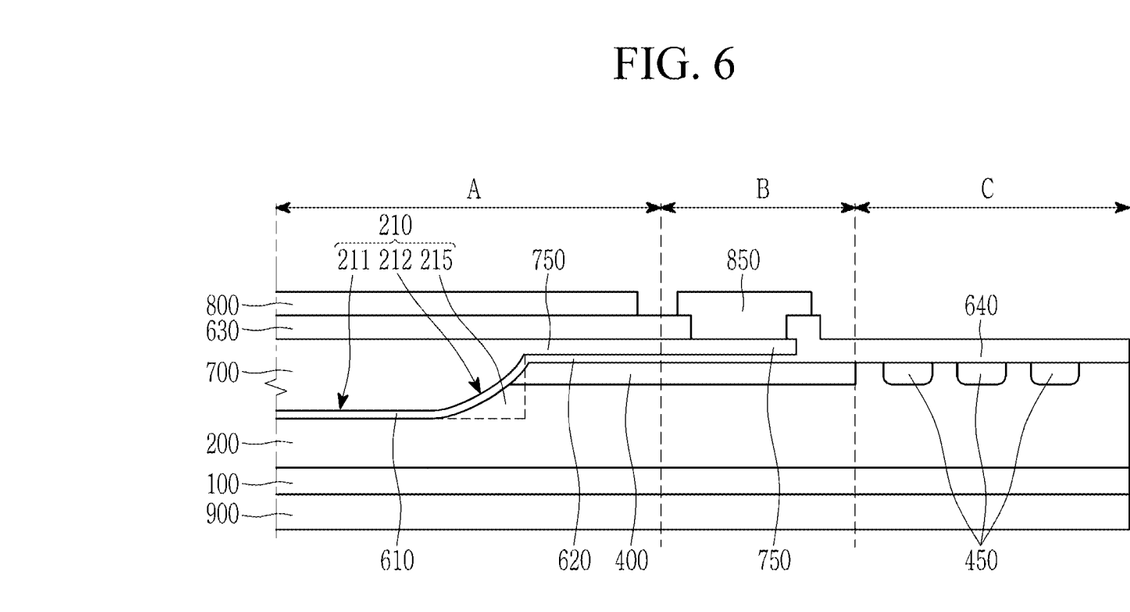
FIG. 6 is a view showing a cross-section of a semiconductor device according to another embodiment of the present disclosure.

The cross-section shape of the inclined side wall 212 of the trench 210 is not limited to the straight line as shown in FIG. 1, but it may be convex upward as shown in FIG. 3 and FIG. 4 or may be concave downward as shown in FIG. 5 and FIG. 6. Here, the top of the inclined side wall 212 of the trench 210 is the direction toward the gate electrode 700, and the bottom is the direction toward the n– type layer 200.

FIG. 3 and FIG. 5 show the case that the region 215 under the inclined side wall 212 of the trench 210 is filled with the insulating material as shown in FIG. 1, and FIG. 4 and FIG. 6 show the case that the n– type layer 200 and the p type region 400 are stacked in the region 215 under the inclined side wall 212 of the trench 210 as shown in FIG. 2.

Figure 7:
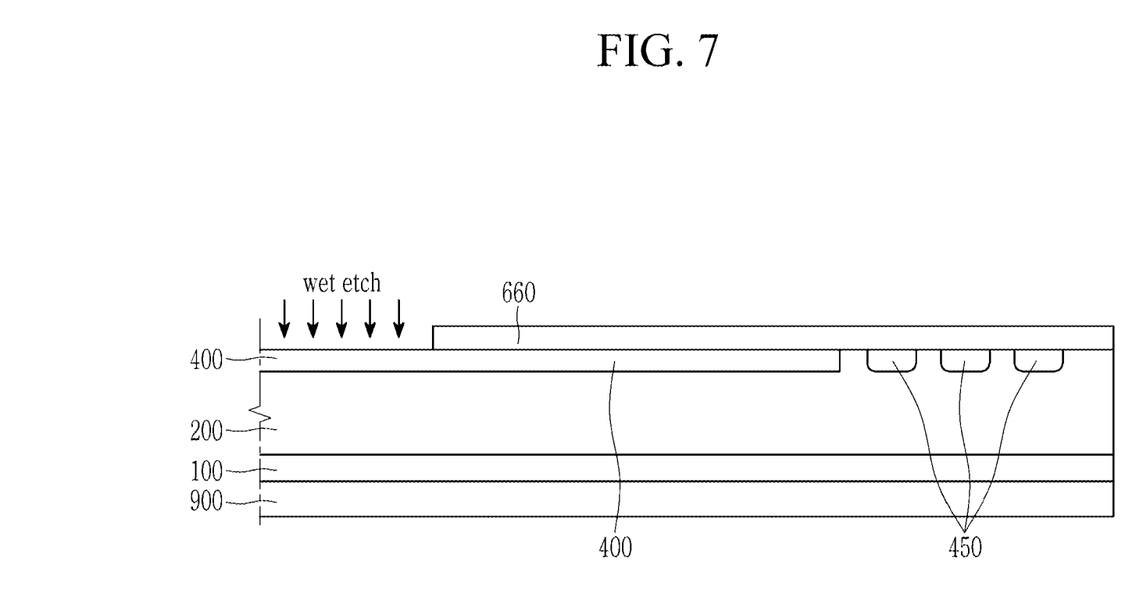
FIG. 7 is a view showing a manufacturing method of a semiconductor device according to an embodiment of the present disclosure.
Figure 8:
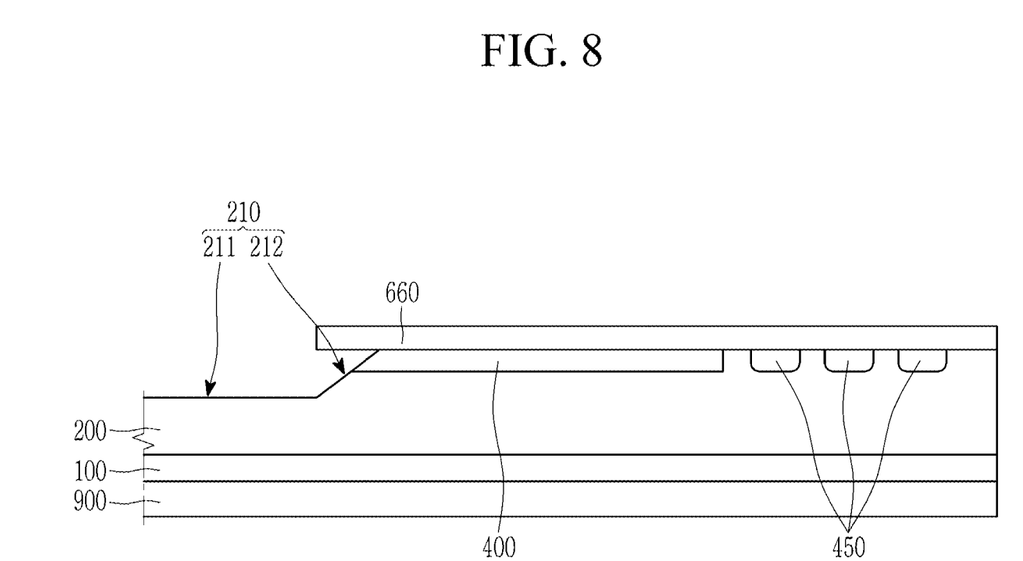
FIG. 8 is a view showing a manufacturing method of a semiconductor device according to another embodiment of the present disclosure.

FIG. 7 and FIG. 8 are views showing a manufacturing method of a semiconductor device according to an embodiment of the present disclosure.

Hereinafter, the manufacturing method of the semiconductor device shown in FIG. 2 is described with reference to FIG. 7 and FIG. 8.

After preparing an n+ type substrate 100, an n– type layer 200 is formed on the first surface of the n+ type substrate 100.

The n+ type substrate 100 and the n– type layer 200 include a conductive region A, a connection region B, and an end region C. The n– type layer 200 may be formed by epitaxial growth or by implanting n– type ions.

A p type region 400 is formed in the conductive region A and the connection region B, and a p type end structure 450 is formed in the end region C. The p type region 400 is formed by implanting p type ions in the upper part of the n– type layer 200. The p type region 400 positioned adjacent to the end region C is formed to extend to the connection region B and is formed to be spaced apart from the p type end structure 450.

The p type end structure 450 is formed by implanting p type ions on the upper surface of the n– type layer 200 of the end region C. The p type end structure 450 includes a plurality of regions injected with p type ions, and the regions injected with p type ions are spaced apart from each other by a predetermined interval.

The p type region 400 may also be formed in a region where a trench 210 will be formed. In this case, the trench 210 is formed by etching the n– type layer 200 and the p type region 400 of the conductive region A. In this case, the n– type layer 200 and the p type region 400 are etched so that the side wall 212 of the trench 210 positioned at the portion where the conductive region A ends. A method for etching the n– type layer 200 and the p type region 400 may use wet etching, and it is possible to change an inclination angle, a shape, and a slanted surface curvature of the side wall 212 of the trench 210 in various ways by changing process conditions of the wet etching.

When forming the trench 210, a hard mask 660 may be formed on the n– type layer 200 and the p type region 400 except for the region where the trench 210 is to be formed. The hard mask 660 may be formed to the upper point corresponding to the position where the inclined side wall 212 of the trench 210 abuts the bottom surface 211 of the trench 210. The hard mask 660, for example, may include $Si_2N_3$.

A gate insulating layer 610 is formed inside the trench 210, and an end insulating layer 620 is formed on the p type end structure 450 and the n– type layer 200 of the end region C. The gate insulating layer 610 and the end insulating layer 620 may include the same material.

Next, a gate electrode 700 is formed on the gate insulating layer 610, and a lower gate runner 750 is formed on the end insulating layer 620.

Next, an oxide layer 630 is formed on the gate electrode 700, and an end oxide layer 640 is formed on the lower gate runner 750.

After forming a contact hole in the end oxide layer 640, a source electrode 800 is formed in the conductive region A, and an upper gate runner 850 is formed in the connection region B. Next, a drain electrode 900 is formed on the second surface of the n+ type substrate 100.

Figure 9:
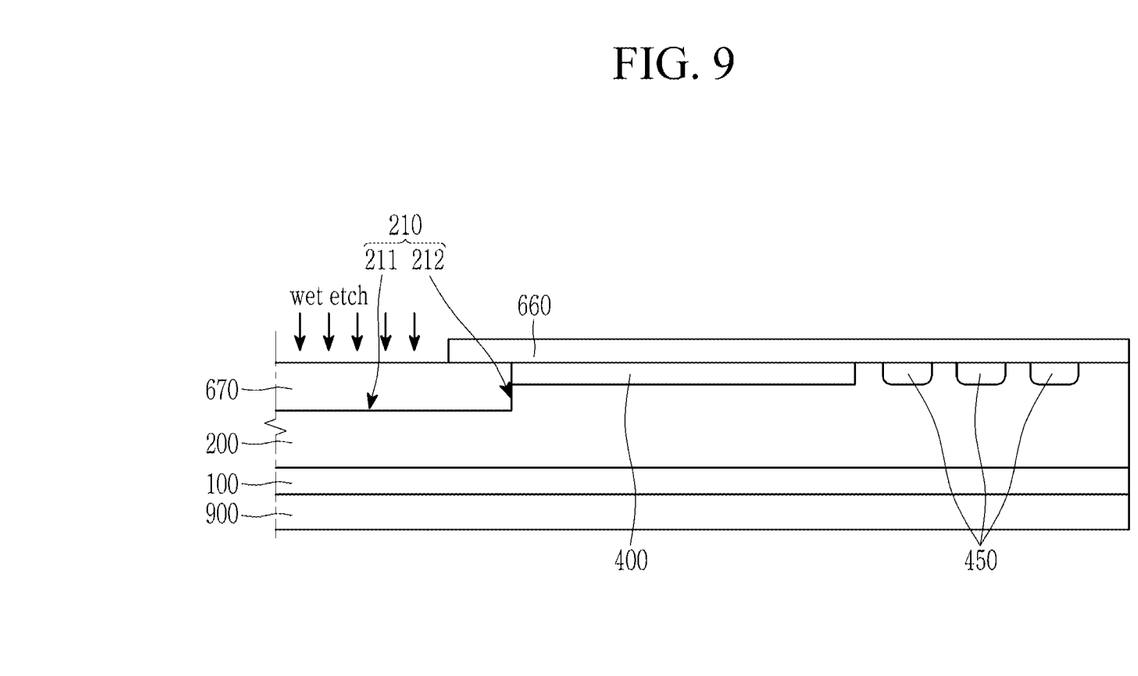
FIG. 9 is a view showing a manufacturing method of a semiconductor device according to another embodiment of the present disclosure.
Figure 10:
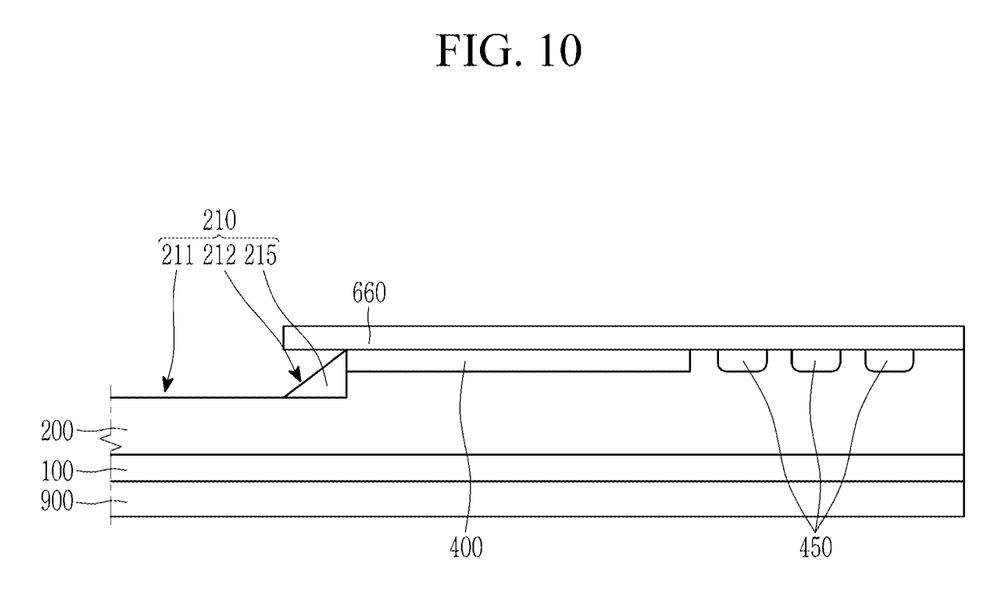
FIG. 10 is a view showing a manufacturing method of a semiconductor device according to another embodiment of the present disclosure.

FIG. 9 and FIG. 10 are views showing a manufacturing method of a semiconductor device according to another embodiment of the present disclosure.

The manufacturing method of the semiconductor device shown in FIG. 1 is described with reference to FIG. 9 and FIG. 10.

The contents for forming the n+ type substrate 100, the n– type layer 200, the p type region 400, and the p type end structure 450 are the same as above-described.

The n– type layer 200 and the p type region 400 of the conductive region A are etched to etch the region where the trench 210 will be formed. The region where the trench 210 is to be filled is filled with an insulating material. The insulating material 670 may be the same material as the gate insulating layer 610.

The insulating material 670 is etched so that the side wall 212 of the trench 210 positioned in the portion where the conductive region A ends is inclined. A method for etching the insulating material 670 may use wet etching, and it is possible to change an inclination angle, a shape, and a slanted surface curvature of the side wall 212 of the trench 210 in various ways by changing process conditions of the wet etching.

In addition, by leaving some insulating material 670, the gate insulating layer 610 may be formed simultaneously with the trench 210.

Thereafter, the contents of forming the end insulating layer 620, the gate electrode 700, the lower gate runner 750, the oxide layer 630, the end oxide layer 640, the source electrode 800, the upper gate runner 850, and the drain electrode 900 are the same as described above.

As described above, since the manufacturing method of the semiconductor device may be performed using the existing ion implantation process and the epi process, the development of a new process technology is not required.

Experimental Example 1: Measuring a Breakdown Voltage of a Semiconductor Device and a Maximum Electric Field of an Oxide Layer In Embodiment 1, the semiconductor device is manufactured with the structure shown in FIG. 1, and in this case, the inclination angle of the trench side wall is formed at 160 degrees, while in Embodiment 2, the semiconductor device is manufactured with the structure shown in FIG. 2, and the inclination angle of the trench side wall is formed at 160 degrees. Comparative Example 1 is a case in which the inclination angle of the trench side wall is 90 degrees as in the prior art.

For the semiconductor device of Embodiment 1, Embodiment 2, and Comparative Example 1, the breakdown voltage and the maximum electric field of the oxide layer were measured using Sentaurus TCAD (Synopsys), and the results are summarized in Table 1.

TABLE 1

| Items | Comparative Example 1 | Embodiment 1 | Embodiment 2 |
|---|---|---|---|
| Breakdown voltage [V] | 749.4 | 953.1 | 1100 |
| Oxide layer electric field [MV/cm] @ 700 V | 5.753 | 5.148 | 4.433 |

Referring to Table 1, for the semiconductor device of Embodiment 1, the breakdown voltage of 953.1 V is increased by 27.2% compared with the breakdown voltage of 749.4 V of the semiconductor device of Comparative Example 1, and for the semiconductor device of Embodiment 2, the breakdown voltage of 1100 V is increased by 49.8% compared with the breakdown voltage of 749.4 V of the semiconductor device of Comparative Example 1.

Also, under the same voltage of 700 V, for the semiconductor device of Embodiment 1, the oxide layer electric field value of 5.148 V/cm$^2$ was decreased by 10.5% compared with the oxide layer electric field value of 5.753 V/cm$^2$ of the semiconductor device of Comparative Example 1, and for the semiconductor device of Embodiment 2, the oxide layer electric field value of 4.433 V/cm$^2$ was decreased by 22.9% compared with the oxide layer electric field value 5.753 V/cm$^2$ of the semiconductor device of Comparative Example 1.

Experimental Example 2: A Breakdown Voltage Measuring of a Semiconductor Device Depending on an Inclination Angle Change of a Trench Side Wall In Embodiment 1-1 to Embodiment 1-3, the semiconductor device was manufactured with the structure shown in FIG. 1, and the inclination angle of the trench side wall was formed at 135 degrees, 150 degrees, 160 degrees, respectively, and in Embodiment 2-1 to embodiment 2-3, the semiconductor device was manufactured with the structure shown in FIG. 2, and the inclination angle of the trench side wall was formed at 135 degrees, 150 degrees, and 160 degrees, respectively. Comparative Example 1 is a case in which the inclination angle of the trench side wall is 90 degrees as in the prior art.

Figure 11:
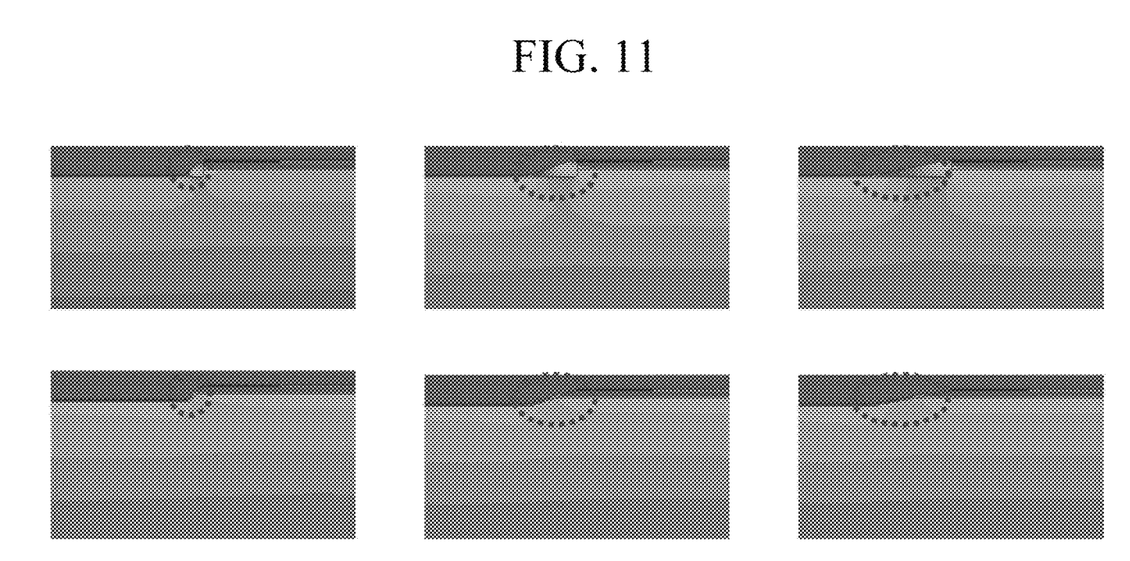
FIG. 11 is a picture showing a result for simulating an electric field distribution in an off state of a semiconductor device according to an Embodiment 1-1 to an Embodiment 1-3 and an Embodiment 2-1 to an Embodiment 2-3.
Figure 12:
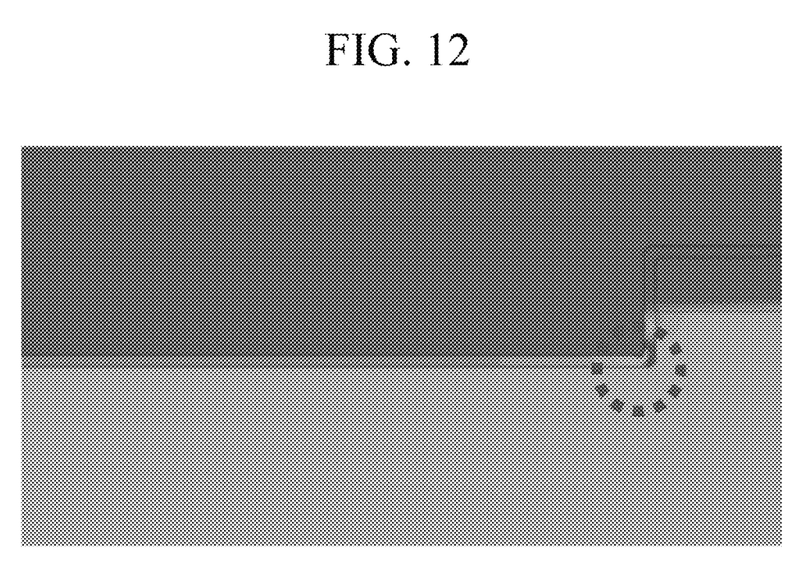
FIG. 12 is a picture showing a result for simulating an electric field distribution in an off state of a semiconductor device according to Comparative Example 1.

For the semiconductor device of Embodiment 1-1 to the Embodiment 1-3, Embodiment 2-1 to Embodiment 2-3, and Comparative Example 1, the breakdown voltages and the oxide layer maximum electric field were measured by using Sentaurus TCAD (Synopsys), and the results are summarized in Table 2, FIG. 11, and FIG. 12.

FIG. 11 is a picture showing a result of simulating an electric field distribution in an off state of a semiconductor device according to Embodiment 1-1 to Embodiment 1-3, and Embodiment 2-1 to Embodiment 2-3. In FIG. 11, the figures from the upper left to the right represent the results for Embodiment 1-1 to Embodiment 1-3, respectively, and the figures from the lower left to the right represent the results for Embodiment 2-1 to Embodiment 2-3, respectively.

FIG. 12 is a picture showing a result for simulating an electric field distribution in an off state of a semiconductor device according to Comparative Example 1.

In FIG. 11 and FIG. 12, a red circle indicates the electric field concentration region.

TABLE 2

|  | Inclination angle [degrees] | Breakdown voltage [V] |
|---|---|---|
| Comparative Example 1 | 90 | 749.4 |
| Embodiment 1-1 | 135 | 640.1 |
| Embodiment 1-2 | 150 | 816.7 |
| Embodiment 1-3 | 160 | 953.1 |
| Embodiment 2-1 | 135 | 726.9 |
| Embodiment 2-2 | 150 | 954.6 |
| Embodiment 2-3 | 160 | 1100.3 |

Referring to Table 2, FIG. 11 and FIG. 12, compared with the inclination angle of 135 degrees of the trench side wall of the semiconductor device of Embodiment 1-1, in the inclination angle of 150 degrees of the trench side wall of the semiconductor device of Embodiment 1-2, the breakdown voltage was increased by 27.6%, and in the inclination angle of 160 degrees of the trench side wall of the semiconductor device of Embodiment 1-3, the breakdown voltage was increased by 48.9%.

Also, compared with the inclination angle of 135 degrees of the trench side wall of the semiconductor device of Embodiment 2-1, in the inclination angle of 150 degrees of the trench side wall of the semiconductor device of Embodiment 2-2, the breakdown voltage was increased by 31.3%, and in the inclination angle of 160 degrees of the trench side wall of the semiconductor device of Embodiment 2-3, the breakdown voltage was increased by 51.4%.

Therefore, it may be confirmed that the electric field dispersion effect increases as the inclination angle of the trench side wall increases.

While the present disclosure has been described in connection with what is presently considered to be practical embodiments, it is to be understood that the present disclosure is not limited to the disclosed embodiments. On the contrary, it is intended to cover various modifications and equivalent arrangements included within the spirit and scope of the appended claims.

What is claimed is:

1. A semiconductor device comprising: a conductive region, wherein the conductive region includes:
   an n+ type substrate,
   an n− type layer positioned at a first surface of the n+ type substrate,
   a p type region positioned on the n− type layer, and
   a gate electrode that fills an inside of a trench penetrating the p type region and positioned in the n− type layer, and
   a side wall of the trench positioned at beside a portion where the conductive region ends is inclined;
   an end region positioned at the portion where the conductive region ends; and
   a connection region positioned between the conductive region and the end region,
   wherein a region under the inclined side wall of the trench is filled with an insulating material, and the region under the inclined side wall of the trench is a region surrounded by the inclined side wall, a line extending horizontally at the intersection point of the inclined side wall and the bottom surface of the trench, and a line extending vertically at the intersection of the inclined side wall and a lower gate runner,
   wherein a p type end structure is positioned in the n− type layer of the end region, and the p type end structure includes a plurality of regions injected with p type ions, and the regions injected with the p type ions are spaced apart from each other by a predetermined interval, and
   the side wall of the trench is inclined from the intersection point of the side wall and the bottom surface of the trench to the intersection of the side wall and the lower gate runner.

2. The semiconductor device of claim 1, wherein
   an angle between a bottom surface of the trench and the inclined side wall is more than 90 degrees to less than 180 degrees.

3. The semiconductor device of claim 2, wherein
   the angle between the bottom surface of the trench and the inclined side wall is greater than 135 degrees to less than 160 degrees.

4. The semiconductor device of claim 1, wherein
   the inclined side wall of the trench has a shape that is concave downward.

5. The semiconductor device of claim 1, wherein
   the inclined side wall of the trench has a shape that is convex upward.

6. The semiconductor device of claim 1, wherein
   the connection region includes:
   the n+ type substrate,
   the n− type layer positioned in the first surface of the n+ type substrate,
   the p type region positioned on the n− type layer,
   the lower gate runner positioned on the p type region and connected to the gate electrode,
   an end oxide layer positioned on the lower gate runner, and
   an upper gate runner positioned on the end oxide layer.

7. The semiconductor device of claim 6, wherein
   the side wall of the trench connecting a bottom surface of the trench and the lower gate runner is inclined.

8. The semiconductor device of claim 6, wherein
   the oxide layer includes a contact hole exposing a part of the lower gate runner, and
   the upper gate runner is in contact with the lower gate runner through the contact hole of the oxide layer.

9. The semiconductor device of claim 1, wherein
   the conductive region includes
   an oxide layer positioned on the gate electrode, and
   a source electrode positioned on the oxide layer and insulated from the gate electrode.

10. The semiconductor device of claim 1, wherein
    the conductive region, the connection region, the end region, or a combination thereof includes a drain electrode positioned on a second surface of the substrate.

11. A manufacturing method of a semiconductor device, comprising:

forming an n– type layer on a first surface of an n+ type substrate including a conductive region, an end region positioned at a portion where the conductive region ends, and a connection region positioned between the conductive region and the end region;

forming a p type region on the n– type layer;

etching the n– type layer to form a trench; and forming a gate electrode in the trench, wherein in the forming of the trench, a side wall of the trench positioned at the portion where the conductive region ends is etched to be inclined, wherein the semiconductor device comprises a conductive region, wherein the conductive region includes an n+ type substrate, an n– type layer positioned at a first surface of the n+ type substrate, a p type region positioned on the n– type layer, and a gate electrode that fills an inside of a trench penetrating the p type region and positioned in the n– type layer, and a side wall of the trench positioned at a portion where the conductive region ends is inclined;

an end region positioned beside the portion where the conductive region ends; and a connection region positioned between the conductive region and the end region, wherein a region under the inclined side wall of the trench is filled with an insulating material, and the region under the inclined side wall of the trench is a region surrounded by the inclined side wall, a line extending horizontally at the intersection point of the inclined side wall and the bottom surface of the trench, and a line extending vertically at the intersection of the inclined side wall and a lower gate runner, wherein a p type end structure is positioned in the n– type layer of the end region, and the p type end structure includes a plurality of regions injected with p type ions, and the regions injected with the p type ions are spaced apart from each other by a predetermined interval, and the side wall of the trench is inclined from the intersection point of the side wall and the bottom surface of the trench to the intersection of the side wall and the lower gate runner.

12. The manufacturing method of the semiconductor device of claim 11, wherein after forming the p type region even in the region where the trench will be formed, the p type region and the n– type layer are etched so that the side wall of the trench is inclined.

13. The manufacturing method of the semiconductor device of claim 11, wherein the forming of the trench includes filling the etched region with an insulating material after etching the region where the trench will be formed, and wet etching the insulating material so that the side wall of the trench is inclined.

14. The manufacturing method of the semiconductor device of claim 11, further comprising: forming an oxide layer on the gate electrode; and forming a source electrode on the oxide layer.

15. The manufacturing method of the semiconductor device of claim 11, further comprising forming a drain electrode on a second surface of the n+ type substrate.

* * * * *